United States Patent [19]

Nicollini et al.

[11] Patent Number: 4,920,325
[45] Date of Patent: Apr. 24, 1990

[54] INTEGRATED ACTIVE ELECTRONIC SWITCHED CAPACITOR FILTER HAVING EXTREMELY LOW SENSITIVITY TO VARIATIONS OF THE COMPONENTS

[75] Inventors: Germano Nicollini, Piacenza, Italy; Daniel Senderowicz, Berkeley, Calif.

[73] Assignee: SGS-Thomson Microelectronics S.p.A., Cantania, Italy

[21] Appl. No.: 160,643

[22] Filed: Feb. 26, 1988

[30] Foreign Application Priority Data

Mar. 5, 1987 [IT] Italy ................ 19590 A/87

[51] Int. Cl.[5] ............................................ H03H 11/12
[52] U.S. Cl. ...................................... 333/173; 330/109
[58] Field of Search .................... 333/173; 330/51, 109

[56] References Cited

U.S. PATENT DOCUMENTS 4,383,228  5/1985  Gaillard .............................. 333/173

FOREIGN PATENT DOCUMENTS 25820  3/1981  Japan ................................. 333/173
157115  12/1981  Japan ................................. 333/173

OTHER PUBLICATIONS

Jacobs, G. M. et al; "Design Techniques for MOS Switched Capacitor Ladder Filters"; *IEEE Trans. on Circuits & Systems;* vol. CAS—25, No. 12, Dec. 1978; pp. 1014–1021.

Primary Examiner—Eugene R. LaRoche
Assistant Examiner—Benny Lee
Attorney, Agent, or Firm—Wolf, Greenfield & Sacks

[57] ABSTRACT

The filter comprises four operational amplifiers in cascade, with switched capacitors in series at the input of every amplifier, with fixed capacitors in parallel to two of said amplifiers, with fixed and switched capacitors in parallel to the remaining amplifiers, and with fixed and switched capacitors in common to groups of several amplifiers in cascade. According to the invention, a path of fixed and switched capacitors in parallel connects the input of the filter to the input of the fourth amplifier, and a fixed capacitor connects the input of the filter to the input of the second amplifier.

3 Claims, 3 Drawing Sheets

INTEGRATED ACTIVE ELECTRONIC SWITCHED CAPACITOR FILTER HAVING EXTREMELY LOW SENSITIVITY TO VARIATIONS OF THE COMPONENTS

BACKGROUND OF THE INVENTION

1. Field of the Invention

The present invention relates to an integrated active electronic filter having extremely low sensitivity to variations of the components, particularly for production in MOS technology.

2. Prior Art

It is known to provide active integrated filters, formed by resistors, capacitors and operational amplifiers, connected in synthesized networks to emulate passive filters made of resistors, inductors and capacitors.

It is also known, for the purpose of improving the precision of the response characteristics of the filter, to provide such integrated filters by replacing the resistors with switched capacitors, which can be obtained in integrated circuits with much greater precision than resistors. In such switched-capacitor filters and precision of the fundamental parameters depends in practice only on the precision of the capacity ratios, and is therefore very high.

For the design of such filters it is known to calculate a conventional passive step-like filter composed of resistors, capacitors and inductors, such that its frequency response complies with a desired mask, and to then obtain from said filter, with an also known procedure, a flowchart in which the components are replaced with the corresponding transfer functions according to Laplace's transform. Finally, synthesis methods are known to provide, starting from said flowchart, an active filter, constituted by operational amplifiers, capacitors and switches (to implement switched capacitors).

In the calculation of the passive step-like filter, it is known to minimize the sensitivity of the response to variations of the components by terminating the filter, at the input and at the output, with two identical resistors (Electronics Letters, vol. 2, pp. 224–225, June 1966, "Inductorless Filters"). This property is also conserved in active filters obtained from the step-like filter with double termination.

As is known to the expert in the field, the selectivity characteristics of a filter improve as the order of the filter rises, that is to say as the number of poles of the filter increases. In an active filter of the type described above, the number of poles is equal to the number of operational amplifiers present in the filter.

In the design of active filters in integrated circuits, the most costly part of circuit from the point of view of silicon area occupation is constituted by the operational amplifiers, and therefore filters are designed with the lowest possible order with regard to the required selectivity. Though it is generally possible to reduce by one the order of the filter, selectivity being equal, by eliminating the double termination, this is generally not done to avoid increasing the sensitivity of the filter.

In most applications, particularly in telecommunications, the frequency response specifications are met with the use of fifth-order filters, and therefore most of the filters produced comprise five operational amplifiers. If the double termination is eliminated, the same requirements of selectivity may generally also be met by a fourth-order filter, but this is not done in practice since it is more important to keep the sensitivity low.

SUMMARY OF THE INVENTION

The aim of the invention is therefore to provide an active filter having selectivity and sensitivity typical of an active filter of the fifth order with double termination, that is to say with five operational amplifiers, using only four amplifiers, with consequent saving of semiconductor area. According to another viewpoint, the aim of the invention is to provide a fourth-order filter with double termination which has the same selectivity as a fourth-order filter with single termination.

The invention achieves the above described aims, as well as other objects and advantages which will become apparent hereinafter, with an active filter comprising four operational amplifiers in cascade, with switched capacitors in series at the input of every amplifier, with fixed capacitors in parallel to two of said amplifiers, with fixed and switched capacitors in parallel to the remaining amplifiers, and with fixed and switched capacitors in common to groups of several amplifiers in cascade, characterized in that a path of fixed and switched capacitors in parallel connects the input of the filter to the input of the fourth amplifier, and a fixed capacitor connects the input to the filter to the input of the second amplifier.

BRIEF DESCRIPTION OF THE DRAWINGS

The invention is now described in greater detail, with reference to a preferred embodiment thereof illustrated in the accompanying drawings, wherein.

DETAILED DESCRIPTION OF THE PREFERRED EMBODIMENTS

Figure 1:
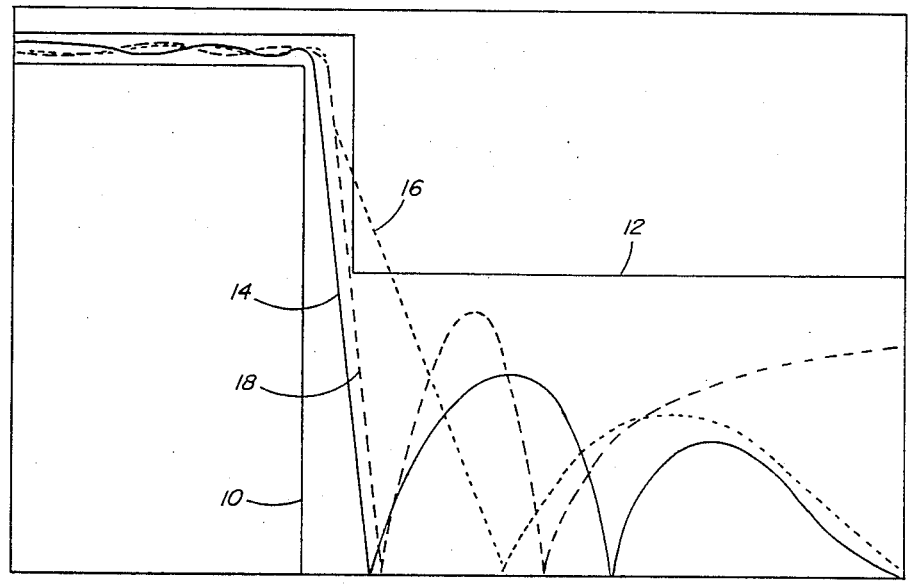
FIG. 1 is a diagram illustrating frequency response curves and masks for different filters.

The diagram of FIG. 1 illustrates the gain, in decibels, of a filter as a function of the frequency, in kHz, of the input signal. The lines 10, 12 define a mask within which the actual response curve of the filter must be confined.

Figure 2:
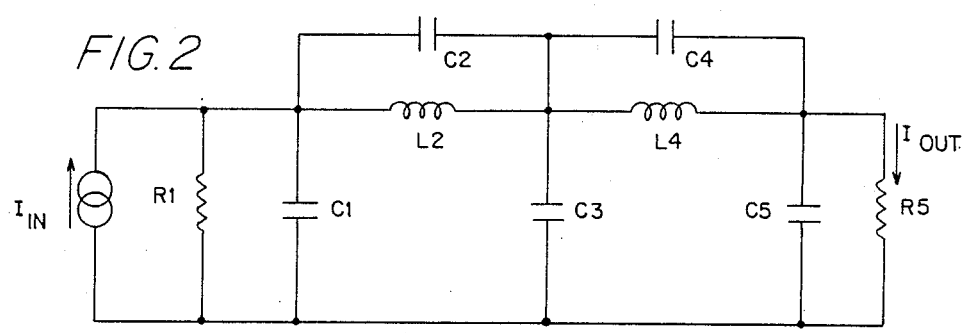
FIG. 2 is a circuit diagram of a passive filter of the fifth order, with double termination.

FIG. 2 illustrates the circuit diagram of a typical step-like passive fifth-order filter, comprising a first branch formed by a resistor $R_1$ and a capacitor $C_1$, a second branch formed by an inductor $L_2$ and a capacitor $C_2$, a third branch constituted by a single capacitor $C_3$, a fourth branch formed by an inductor $L_4$ and by a capacitor $C_4$, and a fifth branch constituted by a resistor $R_5$ and by a capacitor $C_5$. A generator of input current $I_{in}$ is also indicated in the diagram causing an output current $I_{out}$ to flow in resistor $R_5$. The resistors $R_1$ and $R_5$ are termination resistors, equal in value, and the filter is therefore of the double-termination type, with minimum sensitivity to variations of the components, as explained in the introduction.

In FIG. 1 a typical response curve 14 of the filter of FIG. 2, calculated to comply with the mask, is indicated in solid lines. The curve is characterized by five poles and five zeros, two whereof are double finite zeros and one is a simple zero at infinity.

Figure 3:
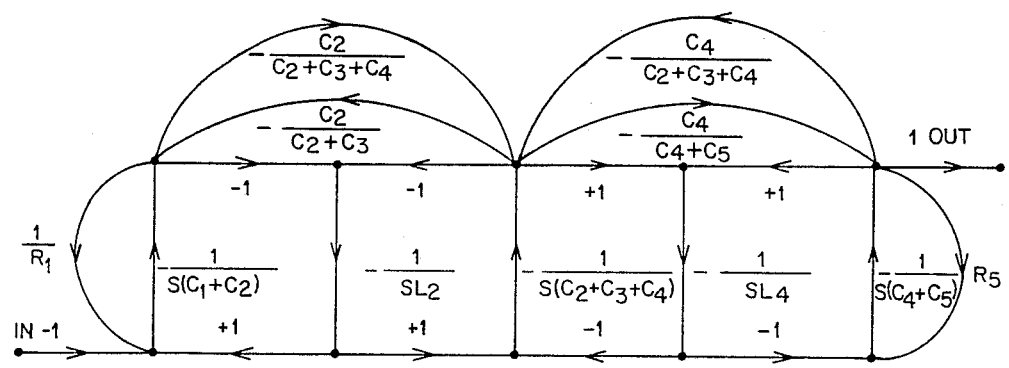
FIG. 3 is a flowchart corresponding to the filter of FIG. 2.

FIG. 3 is the flowchart corresponding to the passive filter of FIG. 2, obtained with per se known transpositions. Next to each branch of the diagram the transfer function is indicated with symbols known to the expert in the field, as a function of the parameters illustrated in FIG. 2. From the flowchart it is possible to synthesize, with known calculation methods, an active filter with five amplifiers, with a set of fixed and switched capacitors. The active filter will also have minimum sensitivity, like its passive precursor.

Figure 4:
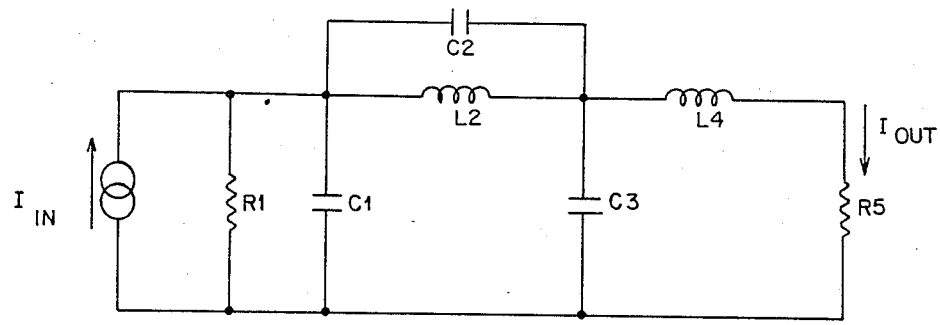
FIG. 4 is a circuit diagram of a fourth-order passive filter, with double termination.
Figure 5:
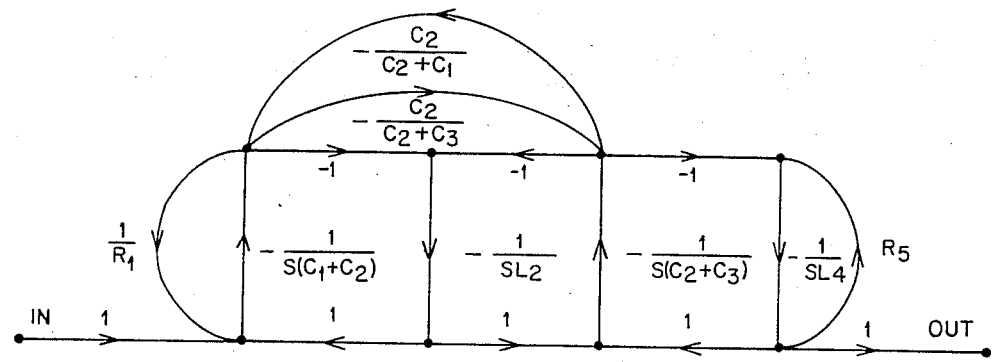
FIG. 5 is a flowchart corresponding to the filter of FIG. 4.

FIG. 4 is a diagram of a fourth-order passive filter with double termination. This filter comprises only four branches, the description whereof is omitted since it is similar to that of FIG. 2, and the corresponding flowchart is illustrated in FIG. 5. With this filter, also within minimum sensitivity, the mask of FIG. 1 can no longer be complied with, as is illustrated by the response curve 16 in dotted lines. This curve has four poles and four zeros, one whereof is a double finite zero and one is a double zero at infinity.

Figure 6:
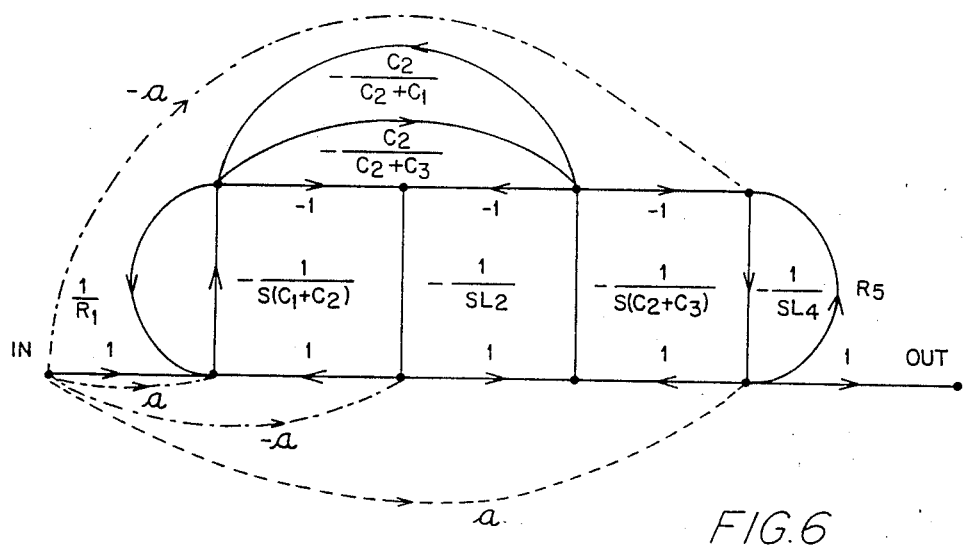
FIG. 6 is a flowchart derived from the diagram of FIG. 5, according to the teachings of the invention.

According to the invention, to improve the selectivity in the flowchart of FIG. 5, the paths indicated in broken lines in FIG. 6 are added. The added paths, two by two with opposite signs, and all identical in absolute value according to an arbitrary constant a, neutralize one another in terms of sensitivity, but have the effect of bringing into the finite region the double zero which was at infinity in the curve 16 of FIG. 1, also slightly moving the other double zero: the response curve 18, which complies with the mask, is thus obtained.

Figure 7:
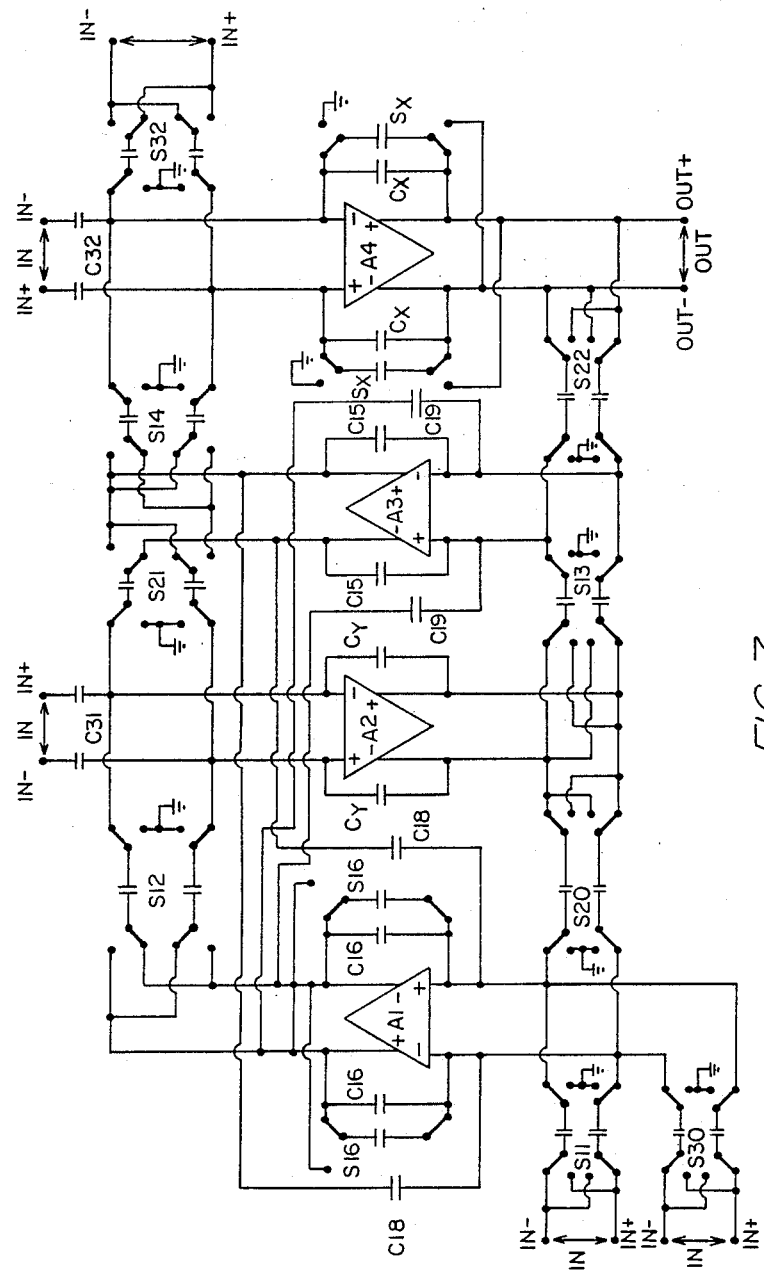
FIG. 7 is the circuit diagram of an active switched-capacitor filter, synthesized starting from the flowchart of FIG. 6.

Using the above described transformation procedures, known to the expert in the field, from the flowchart of FIG. 6 one obtains the synthesized active filter of FIG. 7 which, though having only four amplifiers, simultaneously meets the requirements of double termination (with corresponding minimum sensitivity) and the selectivity requirements imposed by a mask normally complied with by a fifth-order filter with double termination or by a fourth-order filter with single termination.

The filter of FIG. 7, provided according to the "fully differential" mode, comprises four operational amplifiers A1, A2, A3, A4. On the inputs of each amplifier, respective switched capacitors S11, S12, S13, S14 are connected in series. In parallel to the amplifiers A2 and A3, respective fixed capacitors Cy and C15 are connected, and in parallel to the other two amplifiers A1 and A4 respective fixed capacitors and switched capacitors C16, S16; Cx, Sx are connected. Here, and in the claim, a capacitor or other impedance is said as being in parallel to an amplifier when its opposite ends are respectively connected to the input and output of the amplifier. Other fixed capacitors C18, C19 are connected between the input of the first amplifier A1 and the output of the third amplifier A3, and between the output of the first amplifier A1 and the input of the third amplifier A3, respectively. Finally, switched capacitors S20, S21, S22 are connected between the input of the first amplifier A1 and the output of the second A2, between the input of the second and the output of the third amplifier A3, and between the input of the third and the output of the fourth amplifier A4, respectively.

Furthermore, as an effect of the paths added to the flowchart according to the invention, the filter of FIG. 7 furthermore comprises (differently from a fourth-order filter obtained with conventional procedures):

- a switched capacitor S30 with value a which connects the input of the filter to the input of the first amplifier A1;
- a fixed capacitor C31 which connects the input of the filter to the input of the amplifier A2, with value a/Y, Y being the value of the capacity Cy in parallel to the amplifier A2;
- a switched capacitor S32 which connects the input of the filter to the input of the fourth amplifier A4, with value a;
- a fixed capacitor C32 in parallel to the switched capacitor S32, with value a/X, X being the value of the capacitor Cx in parallel to the fourth amplifier A4.

These added fixed and switched capacitors distinguish the filter according to the invention from a conventional filter, and have the effect of moving closer the double zero which without them would be at infinity, allowing to obtain a response curve which complies with the mask, like for a filter of the same order but with single termination. The presence of these added capacitors makes the active filter according to the invention incapable of representation as passive filter. In general there is no passive filter from which the filter according to the invention can be derived.

A preferred embodiment of the invention has been described, but it is understood that it is susceptible to modifications and variations by the expert in the field, according to the given teachings, without thereby abandoning the scope of the invention.

We claim:

1. An active filter having an input and an output, and comprising four operational amplifiers coupled in cascade and each having an input and an output, the output of the fourth of said amplifiers being the output of the filter, with respective switched capacitors coupled in series between the output of the first of said amplifiers and the input of the second of said amplifiers, between the output of the second of said amplifiers and the input of the third of said amplifiers and between the output of the third of said amplifiers and the input of the fourth of said amplifiers, and a switched capacitor coupled from the input of the filter to the input of the first amplifier, with fixed capacitors coupled in parallel to the second and third of said amplifiers, respectively, with fixed and switched capacitors coupled in parallel to the first and fourth amplifiers, respectively, wherein a parallel combination of fixed and switched capacitors connects the input of the filter to the input of the fourth amplifier, and a fixed capacitor connects the input of the filter to the input of the second amplifier.

2. An active filter having an input and an output, and comprising four operational amplifiers coupled in cascade, each having an input and an output, the output of the fourth of said amplifiers being the output of the filter, with respective switched capacitors coupled in series between the output of the first of said amplifiers and the input of the second of said amplifiers, between the output of the second of said amplifiers and the input of the third of said amplifiers and between the output of the third of said amplifiers and the input of the fourth of said amplifiers, a plurality of switched capacitors coupled in parallel from the input of the filter to the input of the first of said amplifiers, fixed capacitors coupled in parallel to the second and third of said amplifiers, fixed capacitors coupled in parallel to the first and said amplifiers, switched capacitors coupled in parallel to the fourth of said amplifiers, three further switched capacitors; one being coupled between the output of the second and the input of the first of said amplifiers, another being coupled between the output of the third and the input of the second of said amplifiers and a further capacitor being coupled between the output of the fourth and the input if the third of said amplifiers, a parallel combination of switched and fixed capacitors connecting the input of said filter to the input of said fourth amplifier, and a fixed capacitor connecting the input of the filter to the input of said second amplifier.

3. An active filter according to claim 2, wherein additional fixed capacitors respectively connect the input of the first amplifier to the output of the third amplifier and the output of the first amplifier to the input of the third amplifier.

* * * * *